US006552256B2

(12) United States Patent
Shakouri et al.

(10) Patent No.: US 6,552,256 B2
(45) Date of Patent: Apr. 22, 2003

(54) TWO-STAGE THREE-TERMINAL THERMIONIC/THERMOELECTRIC COOLERS

(75) Inventors: Ali Shakouri, Santa Cruz, CA (US); Christopher J. LaBounty, Goleta, CA (US); John E. Bowers, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/800,164

(22) Filed: Mar. 6, 2001

(65) Prior Publication Data

US 2001/0050099 A1 Dec. 13, 2001

Related U.S. Application Data

(60) Provisional application No. 60/187,291, filed on Mar. 6, 2000.

(51) Int. Cl.[7] .................. H01L 35/28; H01L 21/461; H02N 10/00; C02D 5/48; C23F 1/00

(52) U.S. Cl. .................. 136/203; 136/201; 257/15; 257/930; 310/306; 205/221; 205/223; 216/58; 216/67; 216/72; 216/75; 438/604; 438/606; 438/220; 438/738; 438/742

(58) Field of Search .................. 136/201, 203, 136/205; 257/930, 15; 310/306; 205/223, 221; 216/13, 41–51, 58, 67, 72, 75; 438/602–606, 720, 738, 742

(56) References Cited

U.S. PATENT DOCUMENTS

| 3,189,765 A | * | 6/1965 | Danko et al. ............... 376/321 |
| 3,430,079 A | * | 2/1969 | Danko et al. ............... 310/306 |
| 5,955,722 A | | 9/1999 | Shakouri et al. ............ 257/467 |

OTHER PUBLICATIONS

Zipse, Donald W., "Grounding", J. Webster (ed.), Wiley Encyclopedia of Electrical and Electronics Engineering Online, Copyright 1999 by John Wiley & Sons, Inc, Dec. 12, 1999, pp. 1–6.*
LaBounty et al., Two Stage Monolithic Thin film Coolers, 2000 InterSociety Conference on Thermal Phenomena, May 2000, pp. 44–47.*
L. Rushing et al., "Micro Thermoelectric Coders for Integrated Applications," Proc. of the 16th Int'l Conf on Thermoelectrics, Dresden, Germany, Aug. 1997, pp. 646–649.
T.A. Corser, "Qualification and Reliability of Thermoelectric Coolers for Use in Laser Modules," 41 Elect. Com. and Tech. Conf., Atlanta, GA, USA, May 1991, pp. 150–156.
A. Shakouri et al., "Thermoelectric Effects in Submicron Heterostructure Barriers," Microscale Therm. Eng., 1998, 2, 37.
A. Shakourie et al., "Thermoelectric Emission Cooling in Single Barrier Heterostructures," Appl. Phys. Lett., Jan. 4, 1999, 74(1):88–89.

(List continued on next page.)

Primary Examiner—Nam Nguyen
Assistant Examiner—Thomas H Parsons
(74) Attorney, Agent, or Firm—Gates & Cooper LLP

(57) ABSTRACT

A multi-stage cooler is formed from monolithically integrated thermionic and thermoelectric coolers, wherein the thermionic and thermoelectric coolers each have a separate electrical connection and a common ground, thereby forming a three terminal device. The thermionic cooler is comprised of a superlattice barrier surrounded by cathode and anode layers grown onto an appropriate substrate, one or more metal contacts with a finite surface area deposited on top of the cathode layer, and one or more mesas of different areas formed by etching around the contacts to the anode layer. The thermoelectric cooler is defined by metal contacts deposited on the anode layer or the substrate itself. A backside metal is deposited on the substrate for connecting to the common ground.

17 Claims, 2 Drawing Sheets

OTHER PUBLICATIONS

G. Zeng et al., "SiGe Micro Cooler," Electronic Letters, Nov. 25, 1999 vol. 35 No. 24, pp 2146–2147.

C. LaBounty et al., "Design of Integrated Thin Film Coolers," Proc of the 18th Int'l Conf on Thermoelectrics, Sep. 1999, pp 23–26.

N.K. Dutta et al., "Monolithically Integrated Thermoelectrically Controlled Diode," Appl. Phys. Lett., Aug. 1, 1985, 47(3):222–224.

P.R. Berger et al., "Monolithically Peltier–cooled Vertical–Cavity Surface–Emitting Lasers," Appl. Phys. Lett., Jul. 1, 1999, 59(1):117–119.

* cited by examiner (a)

(b)

TWO-STAGE THREE-TERMINAL THERMIONIC/THERMOELECTRIC COOLERS

CROSS-REFERENCE TO RELATED APPLICATIONS

This application claims priority under 35 U.S.C. §119(e) to U.S. Provisional Patent Application No. 60/187,291, filed Mar. 6, 2000, by Ali Shakouri, Christopher J. LaBounty, and John E. Bowers, entitled "TWO STAGE THREE-TERMINAL THERMIONIC/THERMOELECTRIC COOLERS," which application is incorporated by reference herein.

STATEMENT REGARDING FEDERALLY SPONSORED RESEARCH OR DEVELOPMENT

This invention was made with Government support under Grant No. N00014-97-1-0860, awarded by the Office of Naval Research, and Grant No. DAAD19-99-1-0158, awarded by the Department of the Army. The Government has certain rights in this invention.

BACKGROUND OF THE INVENTION

1. Field of the Invention

The present invention relates to two-stage, three-terminal thermionic/thermoelectric coolers.

2. Description of the Related Art

Temperature stabilization and control for laser sources, switching/routing elements, and detectors in high speed and wavelength division multiplexed optical telecommunication systems is typically accomplished with thermoelectric (TE) coolers. Since optoelectronic devices are not easily integrated with TE coolers, the cost of packaging is high. In addition, a TE cooler usually limits the reliability and lifetime of a packaged module.

An alternative to conventional TE coolers is heterostructure integrated thermionic (HIT) coolers. These thin film coolers use the selective emission of hot electrons over a heterostructure barrier layer from cathode to anode, resulting in evaporative cooling. The current state of the art for HIT coolers is currently on the order of several degrees cooling across films on the order of one micrometer thick at room temperature. Cooling on the order of several degrees over one-to-two micron thick barriers has been demonstrated in conventional material systems, such as InGaAsP and SiGe, which corresponds to cooling power densities of several hundred Watts/cm$^2$. Single stage thermoelectric coolers are capable of cooling by roughly 70° C. and maximum cooling power densities of approximately 10 Watts/cm$^2$ near room temperature.

A limitation in these thin film devices is the thermal resistance of the substrate on which the epitaxial films are grown. This thermal resistance between the hot side of the cooler and the heat sink can cause much of the heat to flow back to the cold side of the cooler. Several methods for transferring the epitaxial films to surrogate substrates with high thermal conductivity are possible, but they complicate considerably the processing and packaging.

A simpler way of effectively reducing the substrate thermal resistance is to use the substrate itself as a thermoelectric cooler. This concept has been successfully employed in the tuning of in-plane and vertical cavity lasers by changing the current through metal-substrate contact.

The present invention uses thermionic (TI) and thermoelectric (TE) coolers in a two-stage, three-terminal configuration, providing a novel device geometry. The most general use of the cooler of the present invention, also known as a thermionic/thermoelectric (TI/TE) cooler, is for solid state cooling of devices, components, and systems. Since the cooler of the present invention can be fabricated using many different material systems, it lends itself well to integration with optoelectronics and microelectronics.

SUMMARY OF THE INVENTION

To overcome the limitations in the prior art described above, and to overcome other limitations that will become apparent upon reading and understanding the present specification, the present invention discloses a multi-stage cooler formed from monolithically integrated thermionic and thermoelectric coolers, wherein the thermionic and thermoelectric coolers each have a separate electrical connection and a common ground, thereby forming a three terminal device. The thermionic cooler is comprised of a superlattice barrier surrounded by cathode and anode layers grown onto an appropriate substrate, one or more metal contacts with a finite surface area deposited on top of the cathode layer, and one or more mesas of different areas formed by etching around the contacts to the anode layer. The thermoelectric cooler is defined by metal contacts deposited on the anode layer or the substrate itself. A backside metal is deposited on the substrate for connecting to the common ground.

BRIEF DESCRIPTION OF THE DRAWINGS

Referring now to the drawings in which like reference numbers represent corresponding parts throughout.

DETAILED DESCRIPTION OF PREFERRED EMBODIMENT

In the following description, reference is made to the accompanying drawings which form a part hereof, and which show, by way of illustration, a preferred embodiment of the present invention. It is understood that other embodiments may be utilized and structural changes may be made without departing from the scope of the present invention.

Device Structure

Figure 1:
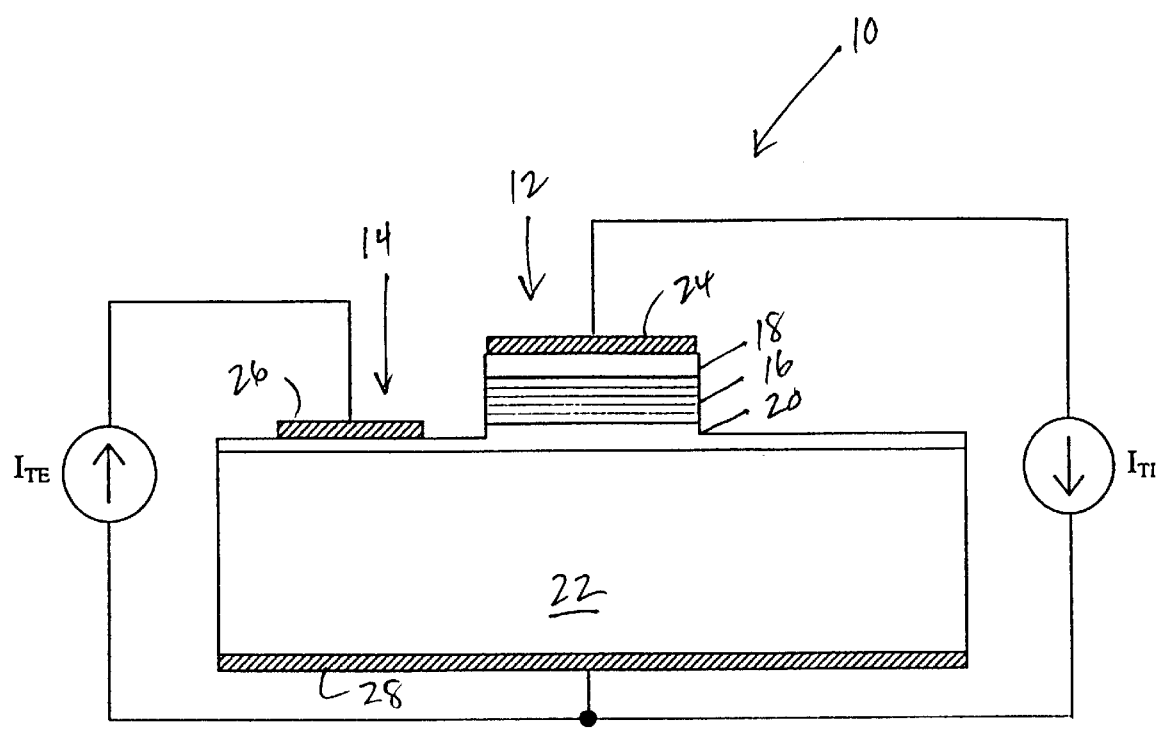
FIG. 1 illustrates the geometry of a two-stage three terminal thermionic/thermoelectric cooler according to the preferred embodiment of the present invention.

FIG. 1 illustrates the geometry of a multi-stage multi-terminal thermionic/thermoelectric cooler device according to the preferred embodiment of the present invention. A two-stage cooler 10 is formed from monolithically integrated thin film thermionic (TI) and thermoelectric (TE) coolers 12, 14, respectively, wherein each cooler 12, 14 stage has a separate electrical connection, but share a common ground, thereby forming a three-terminal cooler 10. By optimizing the geometry of each cooler 12, 14 stage, improved heat spreading can be achieved, thereby resulting in an increase of the cooling power density. Cooling power densities of hundreds of Watts/cm$^2$ are possible using III-V semiconductor material systems, which would allow these coolers 10 to be integrated with optoelectronic devices.

In fabricating the cooler 10, a 2 μm thick superlattice barrier 16 (using 80 periods of 18 nm InGaAs and 7 nm InP in the preferred embodiment) surrounded by n+ InGaAs cathode 18 and anode 20 layers is grown by metal organic chemical vapor deposition (MOCVD) onto an appropriate substrate 22. The cathode 18 and anode 20 layers are 0.3 microns and 0.5 microns thick, respectively, in the preferred embodiment.

Ohmic metal contacts 24 (Ni/AuGe/Ni/Au) with a finite surface area are deposited on the top n+ cathode 18 layer, and one or more mesas of different areas are formed by etching around the contacts 24 to the lower anode 20 layer using dry etching techniques, thereby forming the TI cooler 12 stage.

Ohmic metal contacts 26 are then deposited on the lower n+ InGaAs anode 20 layer to define the TE cooler 14 stage. Alternatively, the second metal contact 26 can be made to the substrate 22 with further etching as the TE cooler 14 stage is defined by the metal-to-semiconductor interface.

Two different contact 26 geometries have been used to study their effects on cooling performance. In a first embodiment, a rectangular contact 26 (80×200 $\mu m^2$) is placed 20 $\mu m$ away from the mesa, and in a second embodiment, a 60 $\mu m$ wide ring contact 26 surrounds the mesa on all sides with the closest edge approximately 20 $\mu m$ away. In the first embodiment, the thermoelectric contact 26 area was constant with varying TI cooler 12 size, while in the second embodiment, it scales with the TI cooler 12 size.

After the TE cooler 14 stage is defined, the substrate 22 is then thinned to 125 $\mu m$ before a backside metal 28 is deposited thereon. The two-stage cooler 10 is then cleaved, packaged, and wire bonded, as required.

The two-stage cooler 10 of the present invention allows for enhanced cooling and heat pumping capabilities over that of a single stage TI cooler. For example, FIG. 1 shows separate electrical connections having positive currents $I_{TE}$ and $I_{TI}$ coupled to the device 10, and sharing a common ground. By changing the current in the lower TE 14 stage, the cooling properties of the upper TI 12 stage can be changed.

Other embodiments of the present invention may add more TI or TE cooler 12, 14 stages to the overall design. This could be accomplished by introducing additional TI cooler 12 stages during the growth, or by packaging the two-stage device 10 onto a conventional TE cooler. The performance and efficiency of the cooler 10 of the present invention can also be improved by integrating p-type and n-type devices together, electrically in series and thermally in parallel.

Fabrication Materials

The growth of epitaxial layers for the TI cooler 12 stage requires the use of a substrate 22 with a similar lattice constant. Hence, the materials used for each section of the cooler 10 are restricted to those material systems that can be practically grown (GaAs/AlGaAsSb, InP/InGaAsP, Si/SiGe, HgCdTe/CdTe, PbTe/PbEuTe, HgCdSe/CdSe). If monolithic integration of a cooler 10 and opto/micro-electronic device is desired, then the most appropriate choice is to use the same material system.

In general, for designing the two-stage cooler 10, the material system should be chosen so that both the TI cooler 12 and TE cooler 14 stages are optimized together. For the TI cooler 12 stage, this includes choosing a barrier 16 material with a low thermal conductivity, high electron mobility, and the ability to generate various barrier heights in the anode 20 and cathode 18 heterojunctions (typically 0–0.4 eV). The optimum material for the TE stage 14 is the same as that of conventional Peltier coolers.

The doping should be such that the contact resistance at the metal-semiconductor interface is minimized while the thermoelectric figure of merit is maximized. One way to relax this constraint on material choice is by transferring the epitaxial layers belonging to the TI cooler 12 to a surrogate substrate with the best possible thermoelectric properties. To further optimize the TE cooler 14 stage, an etch can be made around the lower contact 26 of the TE cooler 14 to further confine the current and heat transport.

Experimental Results

A micro-thermocouple was used to measure the cooling on top of the mesa as a function of thermionic ($I_{TI}$) and thermoelectric ($I_{TE}$) currents. The temperature on top of the mesa was first measured as a function of $I_{TE}$ with $I_{TI}$ set to zero, $T(I_{TE})$. Next, $I_{TE}$ was set to zero, and the temperature was measured as a function of $I_{TI}$, $T(I_{TI})$. Then, $I_{TE}$ was set to various constant values, and the measurement of cooling was repeated as a function of $I_{TI}$, resulting in a temperature on top of the mesa that was a function of both currents, $T(I_{TI}, I_{TE})$. Thermionic and thermoelectric cooling, $Q_{TI}$ and $Q_{TE}$, respectively, were both proportional to current and can be expressed as:

$$Q_{TE} = S \cdot T \cdot I_{TE}$$
$$Q_{TI} = (\Phi_B + 2k_B T/e) \cdot I_{TI}$$

where S is the Seebeck coefficient, T is temperature, $\Phi_b$ is the heterojunction barrier height, $k_B$ is Boltzmann's constant, and e is the charge of an electron. The expression for thermionic cooling is valid in the limit of Boltzmann statistics. Since the cooling was proportional to current and Joule heating was proportional to the square of current; the experimental data can be fitted with a second order polynomial, as shown in Table 1 below.

TABLE 1

| Thermionic Current (mA) | Thermoelectric Current (mA) | Linear coefficient (K/mA) | Quadratic coefficient (K/mA$^2$) |
|---|---|---|---|
| 0 | Independent variable | 0.0015 | −0.00000675 |
| Independent variable | 0 | 0.0085 | −0.00003450 |
| Independent variable | 100 | 0.0100 | −0.00003740 |
| Independent variable | −100 | 0.0083 | −0.00003850 |

From Table 1, the coefficients for thermoelectric cooling can be seen to be substantially smaller than those for the thermionic case. This is due, in part, by the fact that the thermoelectric cooling action is occurring further away from the top of the mesa than that of the thermionic cooling, and in part, due to the inherently smaller thermoelectric cooling properties of InGaAs and InP compared to the thermionic effects.

Figure 2:
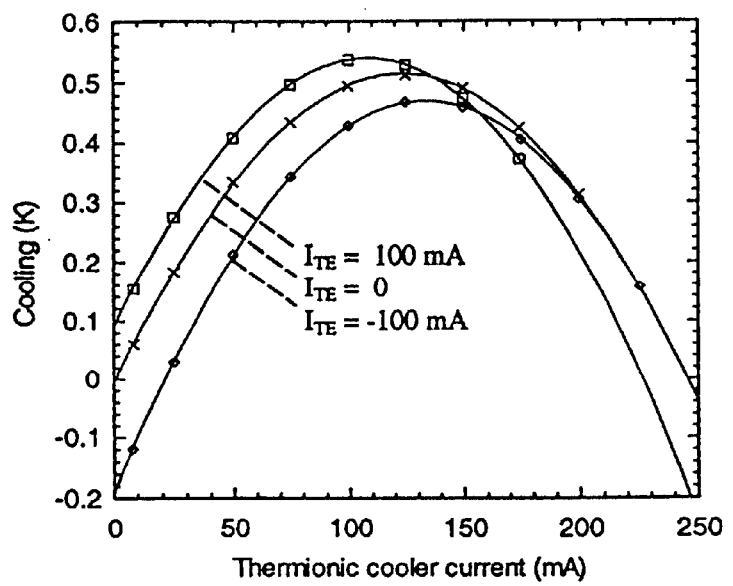
FIGS. 2A and 2B are graphs illustrating cooling versus thermionic cooler current for three different thermoelectric currents (FIG. 2A), and corresponding linear and quadratic coefficients versus thermoelectric current (FIG. 2B).
Figure 2:
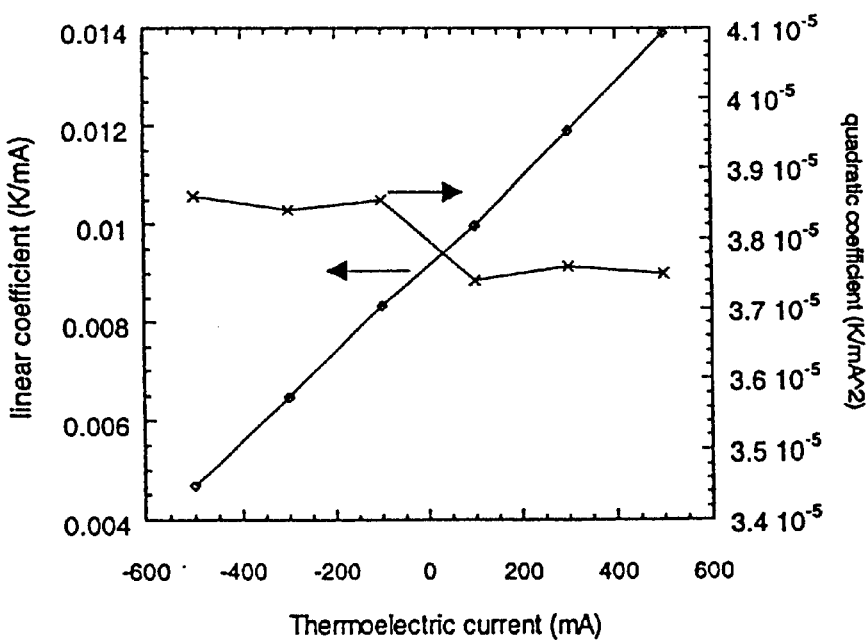

Intuitively, when both currents are biasing each section of the multistage cooler, it is expected that the resulting temperature, $T(I_{TI}, I_{TE})$, would be the sum of the two independent measurements, $T(I_{TI}) + T(I_{TE})$; however, this is not the case, as shown in FIG. 2A.

FIG. 2A illustrates this point graphically by plotting the cooling on top of the thermionic cooler for constant thermoelectric currents of 100 mA, 0 mA, and −100 mA. If superposition applied, then the three curves would look identical with only a vertical shift due to the constant thermoelectric current. This is not the case as any two curves cross each other at some observable point.

FIG. 2B plots the corresponding linear and quadratic fitting coefficients versus $I_{TE}$, and shows that while the heating coefficient remains approximately constant, the linear coefficient is changing linearly with thermoelectric current. Therefore, the constant thermoelectric current not only adds or subtracts a constant amount of cooling, but it also changes the magnitude of the overall cooling term. The reason for this $I_{TE}$-dependent linear coefficient is due to both $I_{TI}$ and $I_{TE}$ superimposing in the substrate region.

If the substrate region has a heating coefficient $\beta_{SUBST}$, then the quadratic term in that region is multiplied by the square of the sum of the currents flowing through it, $-\beta_{SUBST}(I_{TI}+I_{TE})^2$. Expanding this expression yields the normal heating terms, $-\beta_{SUBST} I_{TI}^2$, $-\beta_{SUBST}I_{TE}^2$, and a cross term $-2\beta_{SUBST}I_{TE}I_{TI}$. This cross term can be used to further enhance the overall cooling of this two-stage device. An interesting result of this cross term is that it originates from the heating effects in the substrate. Therefore, even with no additional cooling from the thermoelectric stage, there exists optimum currents $I_{TI}$ and $I_{TE}$ for which the cooling is maximized.

Conclusion

In summary, the present invention discloses a multi-stage, multi-terminal cooler formed from monolithically integrated thermionic and thermoelectric coolers.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description.

What is claimed is:

1. A multi-stage cooler formed from integrated thermionic and thermoelectric coolers, wherein the thermionic and thermoelectric coolers each have separate electrical connections and share a common ground, thereby forming a multi-terminal device.

2. The cooler of claim 1, wherein the thermionic cooler is comprised of:
   a superlattice barrier surrounded by cathode and anode layers grown onto an appropriate substrate;
   one or more metal contacts with a finite surface area deposited on top of the cathode layer,
   one or more mesas of different areas formed by etching around the contacts to the lower anode layer.

3. The cooler of claim 2, wherein the thermoelectric cooler is defined by metal contacts deposited on the anode layer.

4. The cooler of claim 3, wherein a backside metal is deposited on the substrate for connecting to the common ground.

5. The cooler of claim 1, wherein the thermionic cooler's cooling properties are changed by changing a current flow through the thermoelectric cooler.

6. The cooler of claim 1, wherein the multi-stage, multi-terminal cooler is a two-stage cooler.

7. The cooler of claim 1, wherein the multi-stage, multi-terminal cooler is a three-terminal cooler.

8. A method of fabricating a two-stage cooler, comprising:
   (a) depositing an anode layer, a superlattice barrier layer and a cathode layer onto a substrate;
   (b) depositing metal contacts with a finite surface area on the cathode layer;
   (c) forming one or more mesas of different areas by etching around the contacts to the anode layer, thereby forming a thermionic (TI) cooler stage; and
   (d) depositing metal contacts to define a thermoelectric (TE) cooler stage.

9. The method of claim 8, wherein the depositing step (d) comprises depositing metal contacts on the anode layer, thereby defining the TE cooler stage.

10. The method of claim 8, wherein the depositing step (d) comprises depositing metal contacts on the substrate, thereby defining the TE cooler stage.

11. The method of claim 8, further comprising depositing a backside metal on the substrate to provide a ground connection for the device.

12. The method of claim 8, further comprising attaching separate electrical connections to the contacts.

13. A multi-stage cooler comprised of monolithically integrated thermionic and thermoelectric coolers fabricated according to the following method:
   (a) depositing an anode layer, a superlattice barrier layer and a cathode layer onto a substrate;
   (b) depositing metal contacts with a finite surface area on the cathode layer;
   (c) forming one or more mesas of different areas by etching around the contacts to the anode layer, thereby forming a thermionic (TI) cooler stage; and
   (d) depositing metal contacts to define a thermoelectric (TE) cooler stage.

14. The multi-stage cooler of claim 13, wherein the depositing step (d) comprises depositing metal contacts on the anode layer, thereby defining the TE cooler stage.

15. The multi-stage cooler of claim 13, wherein the depositing step (d) comprises depositing metal contacts on the substrate, thereby defining the TE cooler stage.

16. The multi-stage cooler of claim 13, further comprising depositing a backside metal on the substrate to provide a ground connection for the device.

17. The multi-stage cooler of claim 13, further comprising attaching separate electrical connections to the contacts.

* * * * *